United States Patent
Perrault et al.

(10) Patent No.: US 9,089,049 B2
(45) Date of Patent: Jul. 21, 2015

(54) PROCESS TRANSMITTER HOUSING ASSEMBLY WITH VIEWING AREA AND METHOD OF ASSEMBLING SAME

(71) Applicant: Rosemount Inc., Chanhassen, MN (US)

(72) Inventors: Aaron Andrew Perrault, Shakopee, MN (US); George Charles Hausler, Maple Grove, MN (US); Craig Daniel Zelasko, LeSueur, MN (US); Daniel Ronald Schwartz, Hopkins, MN (US)

(73) Assignee: Rosemount Inc., Chanhassen, MN (US)

( * ) Notice: Subject to any disclaimer, the term of this patent is extended or adjusted under 35 U.S.C. 154(b) by 167 days.

(21) Appl. No.: 13/930,013

(22) Filed: Jun. 28, 2013

(65) Prior Publication Data

US 2015/0002753 A1    Jan. 1, 2015

(51) Int. Cl.
| | |
|---|---|
| G06F 1/16 | (2006.01) |
| H05K 7/02 | (2006.01) |
| H05K 13/00 | (2006.01) |
| G02F 1/1333 | (2006.01) |
| H05K 7/14 | (2006.01) |
| G06F 3/0488 | (2013.01) |
| H05K 5/00 | (2006.01) |
| H05K 7/00 | (2006.01) |

(52) U.S. Cl.
CPC ............ *H05K 7/02* (2013.01); *G02F 1/133308* (2013.01); *G06F 1/1601* (2013.01); *G06F 1/1607* (2013.01); *G06F 1/1637* (2013.01); *G06F 3/0488* (2013.01); *H05K 7/1427* (2013.01); *H05K 13/0023* (2013.01); *Y10T 29/49117* (2015.01)

(58) Field of Classification Search
CPC ... G06F 3/0488; G06F 1/1601; G06F 1/1637; G06F 1/1607; G02F 1/133308; G02F 2001/133331; H05K 7/1427

USPC ............ 361/28–730, 752, 796, 809, 679.21, 361/679.03; 375/295; 73/118, 756; 368/281, 283; 340/870.01, 870.02; 349/58, 59, 60; 345/173
See application file for complete search history.

(56) References Cited

U.S. PATENT DOCUMENTS

| | | | |
|---|---|---|---|
| 6,062,095 A * | 5/2000 | Mulrooney et al. | .......... 73/866.5 |
| 7,134,354 B2 | 11/2006 | Nelson et al. | |
| 7,472,608 B2 | 1/2009 | Hedtke | |
| 8,315,058 B2 | 11/2012 | Schwartz et al. | |

(Continued)

FOREIGN PATENT DOCUMENTS

| | | |
|---|---|---|
| JP | 2008096394 A | 4/2008 |
| JP | 2012140041 A | 7/2012 |
| KR | 20110105457 A | 9/2011 |

OTHER PUBLICATIONS

International Search Report and Written Opinion, dated Sep. 24, 2014, for PCT Application No. PCT/US2014/039781, 10 pages.

*Primary Examiner* — Hoa C Nguyen
*Assistant Examiner* — Binh Tran
(74) *Attorney, Agent, or Firm* — Kinney & Lange, P.A.

(57) ABSTRACT

A process transmitter housing assembly includes a housing and a cover assembly including a cover chassis and a transparent cover piece. The cover chassis includes a cover flange extending inward from a perimeter of the cover chassis. Internal threads of the cover chassis threadedly engage external threads of the housing. The transparent cover piece is mechanically clamped between the cover flange and a surface of the housing nearest the cover flange when the cover chassis is threadedly secured to the housing.

18 Claims, 4 Drawing Sheets

(56) References Cited

U.S. PATENT DOCUMENTS

| | | |
|---|---|---|
| 8,334,788 B2 | 12/2012 | Hausler et al. |
| 2007/0152645 A1 | 7/2007 | Orth |
| 2007/0268153 A1 | 11/2007 | Gansen |
| 2012/0236033 A1 | 9/2012 | Rud et al. |
| 2013/0014588 A1 | 1/2013 | Feldmeier |
| 2013/0083824 A1 | 4/2013 | Bronczyk et al. |

* cited by examiner

PROCESS TRANSMITTER HOUSING ASSEMBLY WITH VIEWING AREA AND METHOD OF ASSEMBLING SAME

BACKGROUND

The present invention relates generally to transmitter housing assemblies for industrial process transmitters, and in particular to a transmitter housing assembly including a local operator interface and methods of assembling the same.

Industrial process transmitters are used in industrial process facilities in a variety of settings. For example, industrial process transmitters can include a sensor to sense pressure, temperature, vibration, flow, or nearly any other parameter associated with an industrial process, and/or can include an actuator or other device that manages, controls, or otherwise interacts with an industrial process. Many industrial process facilities are located in corrosive environments, or may be subject to a risk of fire, explosion, or vibration, and therefore industrial process transmitters must generally be constructed to be explosion-proof and otherwise able to withstand operating environment conditions. The industrial process transmitter can communicate—wirelessly or using a hard-wired connection—with a control room, other device, etc. to help provide industrial process management. Typically, industrial process transmitters are installed at desired locations and are configured by an operator at the installation location using a programming device. However, such programming devices can be costly, and must be transported to the installation location for use by the operator. Yet it is desired to be able to configure an industrial process transmitter without having to remove the transmitter cover from the transmitter housing. Covers may be difficult to remove and then reinstall in the field. Importantly, cover removal undesirably exposes interior regions of the transmitter to the environment.

A local operator interface may be provided to allow configuration of the process transmitter without removal of the cover from the housing. Such devices typically include a transmitter cover having a transparent cover piece for viewing a display and may also include capacitive touch buttons for configuring the transmitter. It is desirable to provide a local operator interface with as large a display as possible for a given housing size, while accommodating the capacitive touch buttons.

SUMMARY

A process transmitter housing assembly includes a housing and a cover assembly. The housing includes external threads on an exterior of the housing. The cover assembly includes a cover chassis and a transparent cover piece. The cover chassis includes a cover flange and internal threads on an interior of the cover chassis. The cover flange extends inward from a perimeter of the cover chassis at a first end of the cover chassis. The internal threads are at a second end of the cover chassis opposite the first end. The internal threads of the cover chassis are for threadedly engaging the external threads of the housing. The transparent cover piece is mechanically clamped between the cover flange and a surface of the housing nearest the cover flange when the cover chassis is threadedly secured to the housing.

A method of assembling a process transmitter housing assembly includes first inserting a transparent cover piece into a cover chassis of the process transmitter and against a cover flange extending inward from a perimeter of the cover chassis at a first end of the cover chassis. Next, threads on an interior of the cover chassis at a second end of the cover chassis opposite the first end are engaged with threads on an exterior of a housing of the process transmitter housing assembly. Finally, the transparent cover piece is clamped between the cover flange and a surface of the housing nearest the cover flange by threadedly securing the cover chassis to the housing.

While the above-identified drawing figures set forth several embodiments of the invention, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale. Like reference numbers have been used throughout the figures to denote like parts.

DETAILED DESCRIPTION

In general, the present invention provides a process transmitter housing assembly suitable for use with an industrial process transmitter configured to meet operating environment requirements, such as having a flame-proof electronics enclosure. The process transmitter housing assembly includes a local operator interface to allow configuration of the process transmitter without removal of a transmitter cover assembly from the housing. The transmitter cover assembly includes a transparent cover piece for viewing a display and may also include capacitive touch buttons for configuring the transmitter. Embodiments of the present invention include components that clamp the transparent cover piece in line with the housing to enable a local operator interface with as large a display as possible for a given housing size, while accommodating the capacitive touch buttons. By employing the housing as a mechanical backup for the transparent cover piece, component costs associated with a separate mechanical backup (e.g., a snap ring) are eliminated, reducing the cost of the process transmitter housing assembly.

In other embodiments of the present invention, additional advantages may be found. By integrating a deformable ring with a display shroud holding the local operator interface and positioning the deformable ring between the transparent cover piece and the housing, the local operator interface can be positioned such that capacitive touch buttons and the display are consistently positioned relative to the transparent cover piece. Consistent positioning of the local operator interface provides for the desired viewing of the display and for reliable operation of the capacitance touch buttons. Use of the display shroud with the integrated deformable ring provides an opportunity to include an O-ring between the display shroud and the housing to increase isolation of the local operator interface from damaging vibration. Integration of the deformable ring with the display shroud further reduces the cost of the process transmitter housing assembly.

Figure 1:
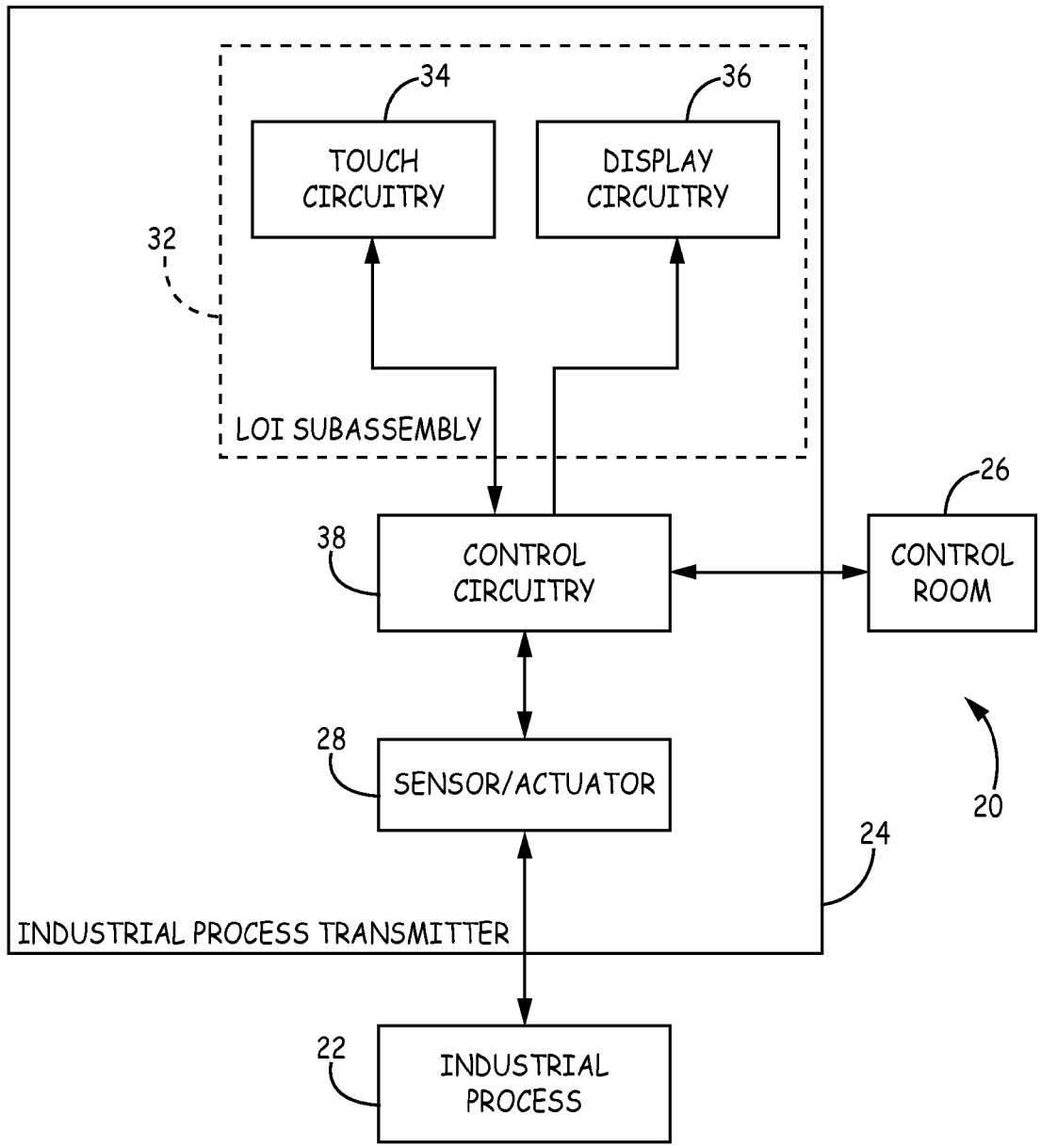
FIG. 1 is a block diagram illustrating an industrial process management system including an industrial process transmitter according to the present invention.

FIG. 1 is a block diagram illustrating industrial process management system 20 for use with industrial process 22. Industrial process management system includes industrial process transmitter 24, and control room 26. Industrial process transmitter 24 includes sensor/actuator 28, and local operator interface (LOI) 32, which includes capacitive touch circuitry 34 and display circuitry 36. Control circuitry 38 is also provided.

Control room 26 can include displays, processors, memory, asset management or control software (e.g., AMS Suite and PlantWeb® software available from Emerson Process Management, Chanhassen, Minn.), and other components for managing and controlling industrial process 22 and for collecting and analyzing data from industrial process transmitter 24.

Sensor/actuator 28 is positioned to interact with industrial process 22. In various embodiments sensor/actuator 28 can be configured to sense pressure, temperature, vibration, flow, or nearly any other parameter associated with industrial process 22 and/or can include an actuator or other device that manages, controls, or otherwise interacts with industrial process 22. Control circuitry 38 is electrically connected to sensor/actuator 28, and can be of any suitable configuration for controlling operation of sensor/actuator 28, gathering data, processing data, etc. It should be noted that in alternative embodiments can be implemented as a plurality of discrete circuitry subassemblies, and separate control circuitry (not shown) can be provided for sensor/actuator 28.

LOI 32 includes touch circuitry 34, which can be of any suitable configuration to enable touch actuation by an operator, and display circuitry 36, which can be configured as one or more liquid crystal displays (LCDs) with optional backlighting functionality, or as any other type of digital or analog display capable of producing a visual output. In one embodiment, touch circuitry 34 provides one or more touch actuatable regions defined by electrically conductive pads (or buttons) for selectively forming a capacitor with an appendage (e.g., finger) of an operator positioned near any of those regions of touch circuitry 34. In that way, touch circuitry 34 can provide capacitive touch actuation in a known manner. It will be appreciated that the conductive pads or buttons defining the touch actuatable regions of touch circuitry 34 can have any suitable configuration, as desired for particular applications. In some embodiments, touch circuitry 34 and display circuitry 36 could be located adjacent to one another. In other arrangements, touch circuitry 34 can have substantially transparent electrical traces and be positioned over display circuitry 36.

Control circuitry 38 controls operation of both touch circuitry 34 and display circuitry 36. For example, control circuitry 38 can control the generation of displays on display circuitry 36 and the recognition and processing of operator actuation of touch circuitry 34. Control circuitry 38 can include one or more processors of conventional configurations.

Industrial process transmitter 24 can communicate with control room 26. Communication between industrial process transmitter 24 and control room 26 can be through any suitable wireless or hard-wired connection. For example, communication may be represented by an analog current over a two-wire loop that ranges from 4 to 20 mA. Alternatively, the communication may be transmitted in a digital form over a two-wire loop using the HART digital protocol, over a communication bus using a digital protocol such as Foundation fieldbus, or by wireless transmission using a wireless protocol such as WirelessHART (IEC 62591). Moreover, communication with control room 26 can be direct or through a network of any number of intermediate devices, for example, a wireless mesh network (not shown). Control circuitry 38 can help manage and control communication to and from industrial process transmitter 24.

Industrial process transmitter 24 can include additional components not specifically shown in FIG. 1. Moreover, it will be appreciated that the particular configuration of industrial process transmitter 24 can vary as desired for particular applications.

Figure 2:
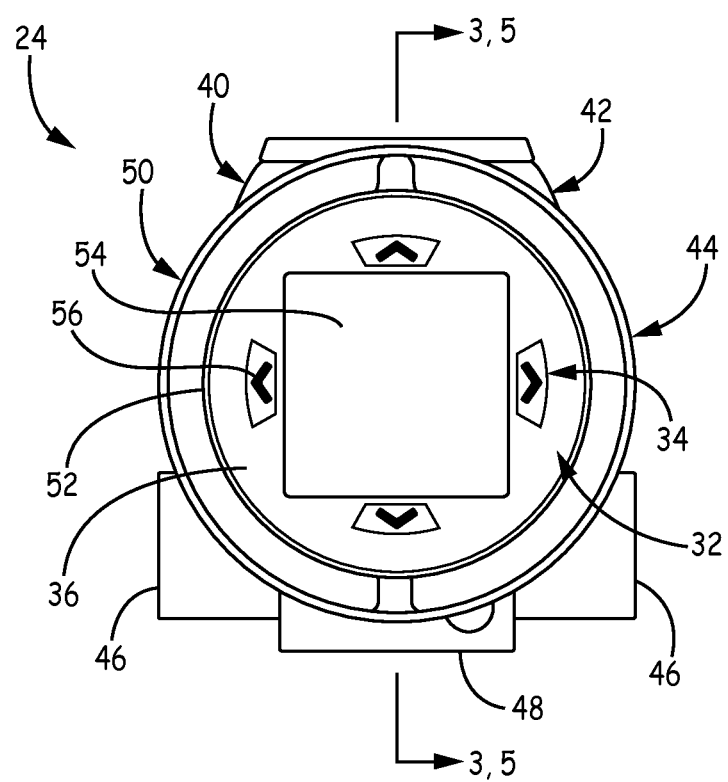
FIG. 2 is a front view of a portion of the process transmitter housing assembly embodying the present invention.

FIG. 2 is a front view of process transmitter housing assembly 40 of industrial process transmitter 24 embodying the present invention. As shown in FIG. 2, process transmitter housing assembly 40 includes housing 42, cover assembly 44, and LOI 32. LOI 32 includes capacitive touch circuitry 34 and display circuitry 36. Housing 42 includes conduit entries 46, and sensor/actuator connection 48. Cover assembly 44 includes cover chassis 50 and transparent cover piece 52.

Housing 42 can have a generally cylindrical shape and can be made of any suitable materials, such as metallic or polymeric materials. Known manufacturing processes can be used to make housing 42, such as casting, machining and molding processes, or any other suitable manufacturing processes. Housing 42 can be a dual compartment housing including an electronics compartment and a field terminal compartment. Cover chassis 50 can be made of a metallic material, a polymeric material, or other suitable material, and also has a generally cylindrical shape. Transparent cover piece 52 can be made of glass that is approximately 6 mm or more thick. Field wiring (not shown) can be fed through conduit entries 46 to connect industrial process transmitter 24 to control room 26, as described in reference to in FIG. 1. Alternatively, an antenna connection can be fed through conduit entries 46 as part of a wireless connection to control room 26. Sensors/actuator 28 can connect to process transmitter housing assembly 24 at sensor/actuator connection 48 by, for example, a welded or threaded connection (not shown).

In the illustrated embodiment, display circuitry 36 defines viewing area 54. Viewing area 54 is a square region at a central portion of display circuitry 36 that is capable of producing a digital display. In other embodiments, viewing area 54 can have nearly any configuration as desired for particular applications. Display circuitry 36 can incorporate one or more LCD screens, or other suitable display.

Capacitive touch circuitry 34 includes at least one button 56 (four buttons 56 illustrated in the embodiment). When a user touches transparent cover piece 52 proximate button 56 to select button 56, a field path is formed between the user's finger and button 56 through transparent cover piece 52. The field capacitively interacts with button 56 to signal to capacitive touch circuitry 34 that button 56 is selected.

As discussed in greater detail below in reference to FIGS. 3 and 4, transparent cover piece 52 fits into cover chassis 50 to form cover assembly 44. LOI 32, including capacitive touch circuitry 34 and display circuitry 36, is disposed within housing 42 such that when cover assembly 44 is fitted to housing 42, viewing area 54 of display circuitry 36 is visible, and button 56 of capacitive touch circuitry 34 is operable, through transparent cover piece 52.

Figure 3:
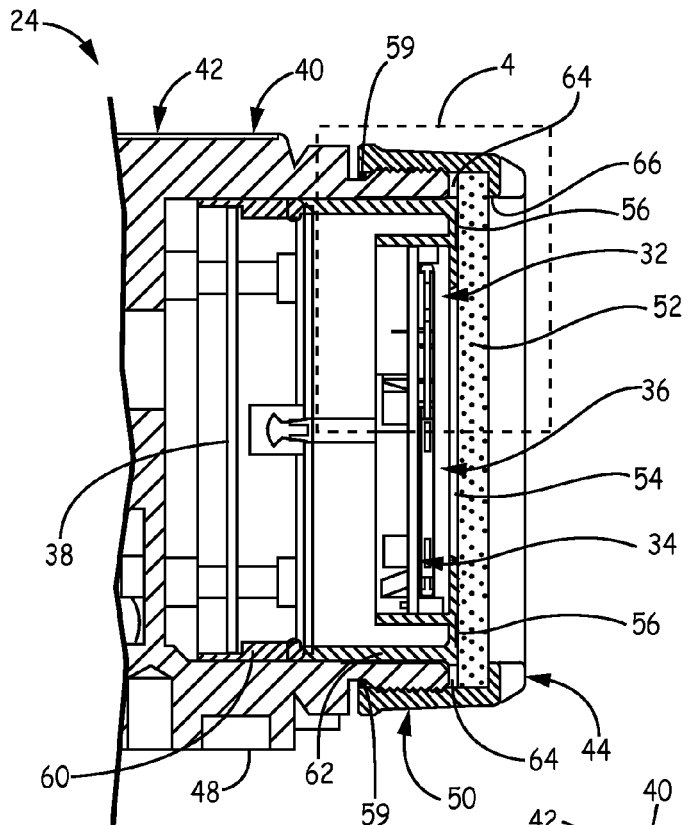
FIG. 3 is a cross-sectional view of the process transmitter housing assembly shown in FIG. 2.

FIG. 3 is a cross-sectional view of the electronics compartment of process transmitter housing assembly 40 of industrial process transmitter 24 shown in FIG. 2. As shown in FIG. 3, process transmitter housing assembly 40 further includes housing seal 59, electronics shroud 60, display shroud 62, and deformable ring 64. Cover chassis 50 further includes cover flange 66. Electronics shroud 60 supports control circuitry 38. Display shroud 62 supports LOI 32, including capacitive touch circuitry 34 and display circuitry 36. Housing seal 59 may be an o-ring seal. Electronics shroud 60 and display shroud 62 are typically cylindrical in shape to fit within housing 42. In the embodiment shown in FIG. 3, display shroud 62 is physically supported by electronic shroud 60. This physical support by electronic shroud 60 properly positions LOI 32 relative to housing 42. Deformable ring 64 is a circular ring made of a deformable material, for example, some types of polymeric materials. As illustrated in in FIG. 3, deformable ring 64 has a rectangular cross-section. However, other cross-sectional profiles may be employed. Cover flange 66 is an integral portion of cover chassis 50 that extends radially inward from a perimeter of cover chassis 50 at a first end of cover chassis 50.

Figure 4:
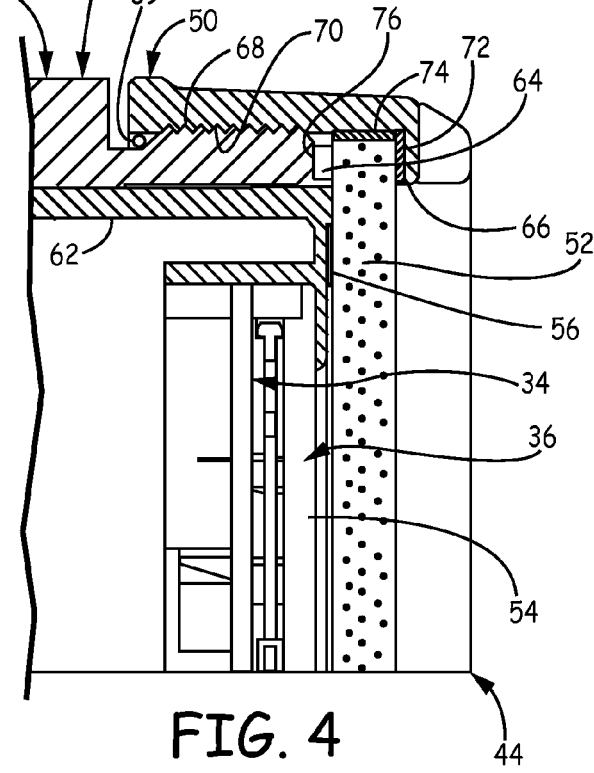
FIG. 4 is an enlarged cross-sectional view of the process transmitter housing assembly shown in FIG. 3.

FIG. 4 is an enlarged cross-sectional view of process transmitter housing assembly 40 shown in FIG. 3. As shown in FIG. 4, housing 42 further includes external threads 68. External threads 68 are formed on an exterior of housing 42. Cover chassis 50 further includes internal threads 70. Internal threads 70 are formed on an interior of cover chassis 50 at a second end of cover chassis 50 opposite the first end of cover chassis 50. Cover assembly 44 further includes sealing gasket 72 and adhesive material 74. Sealing gasket 72 is circular ring made of an elastic material, for example, a polymeric material. Adhesive material 74 can be, for example, an epoxy resin.

Considering FIGS. 3 and 4 together, internal threads 70 are for threadedly engaging cover assembly 44 to housing 42 at corresponding external threads 68. Sealing gasket 72 can be disposed immediately adjacent to a side of cover flange 66 facing internal threads 70. Transparent cover piece 52 is disposed immediately adjacent to sealing gasket 72, opposite cover flange 66. Adhesive material 74 can be deposited between transparent cover piece 52 and a portion of cover chassis 50 adjacent to cover flange 66 to secure transparent cover piece 52 to cover chassis 50 and to provide a cemented joint flame path. Deformable ring 64 can be disposed between transparent cover piece 52 and housing surface 76. Housing surface 76 is a surface of housing 42 nearest cover flange 66 when cover chassis 50 is threadedly secured to housing 42. Housing seal 59 fits around the exterior of housing 42 adjacent to external threads 68.

Once cover chassis 50 is threadedly secured to housing 42, transparent cover piece 52 is mechanically clamped between cover flange 66 and housing surface 76. In this way, housing surface 76 of housing 42 provides a mechanical backup to the cemented joint flame path as required by some safety standards, for example, IEC 60079-1 2007 section 6.2. Housing seal 59 provides a seal between the exterior of housing 42 and the interior of cover chassis 50 adjacent to the second end of cover chassis 50.

Thus, housing 42 and cover assembly 44, when engaged together, provide a sealed, fire-proof, and explosion-proof enclosure for industrial process transmitter 24. Deformable ring 64 can account for reasonable flatness variation between transparent cover piece 52 and housing surface 76. Sealing gasket 72 can provide an environmental seal to protect electronic components in process transmitter housing assembly 40. Importantly, by using housing surface 76 as the mechanical backup for the cemented joint flame path, the use of a separate mechanical piece for mechanical backup is avoided. Such a separate mechanical backup would necessarily be located radially inward from housing surface 76, forcing the positioning of buttons 56 of capacitive touch circuitry 34 radially inward to avoid capacitive interference from the separate mechanical backup. Because embodiments of the present invention have no need for a separate mechanical backup, buttons 56 may be disposed at more radially outward positions, freeing up space such that viewing area 54 can be made significantly larger. Thus, embodiments of the present invention include components that clamp transparent cover piece 52 in line with housing 42 providing for LOI 32 with as large a display (viewing are 54) as possible for a given housing size, while accommodating buttons 56 of capacitive touch circuitry 34. Additionally, by eliminating the separate mechanical backup, component costs associated with such a separate mechanical backup are eliminated, reducing the cost of industrial process transmitter 24.

Figure 5:
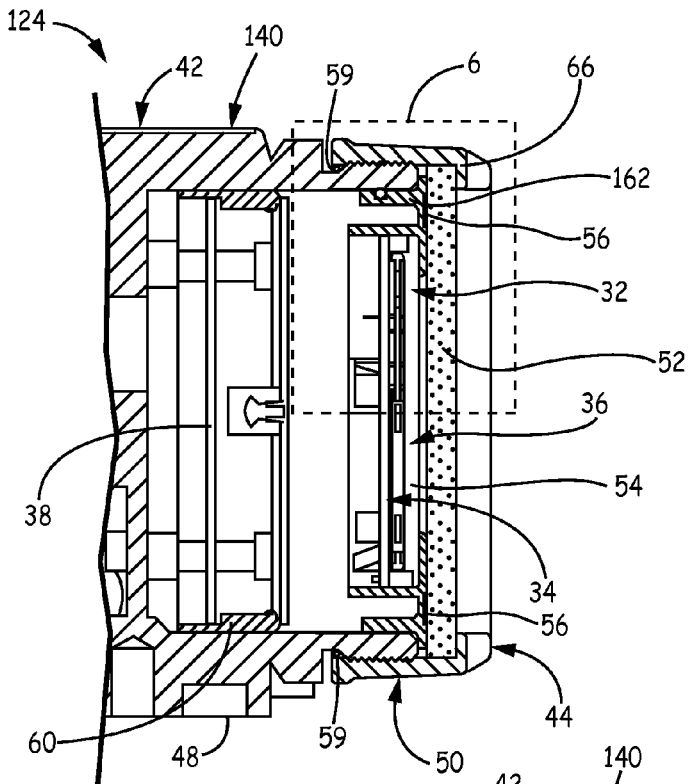
FIG. 5 is cross-sectional view of a process transmitter housing assembly illustrating another embodiment of the present invention.
Figure 6:
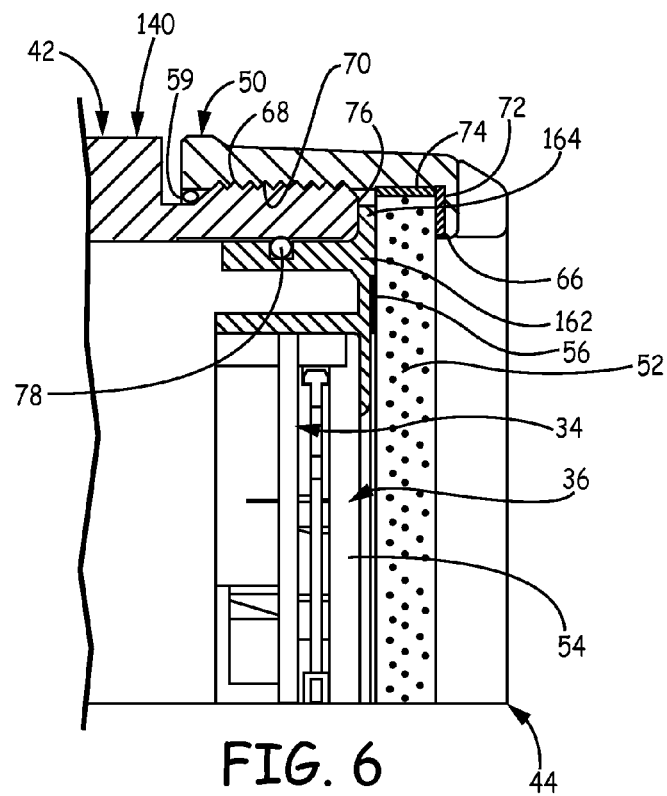
FIG. 6 is an enlarged cross-sectional view of the process transmitter housing assembly shown in FIG. 5.

FIG. 5 is cross-sectional view of process transmitter housing assembly 140 illustrating another embodiment of the present invention. FIG. 6 is an enlarged cross-sectional view of process transmitter housing assembly 140 shown in FIG. 5. The embodiment illustrated in FIGS. 5 and 6 includes all of the benefits and advantages described above for the embodiment of FIGS. 3 and 4 in addition to the benefits described below. In the embodiment illustrated in FIGS. 5 and 6, industrial process transmitter 124 is identical to industrial process transmitter 24 described above in reference to FIGS. 3 and 4, except that process transmitter housing assembly 140 includes display shroud 162 instead of display shroud 62 and deformable ring 64 is replaced by deformable ring 164. Also, process transmitter housing assembly 140 further includes elastomeric ring 78.

As with display shroud 62, display shroud 162 supports LOI 32, including capacitive touch circuitry 34 and display circuitry 36. Deformable ring 164 is a circular flange extending radially outward at an end of display shroud 162 nearest transparent cover piece 52. Deformable ring 164 is integral with display shroud 162. Display shroud 162 and deformable ring 164 are made of a deformable material, for example, a polymeric material. Unlike the embodiment shown in FIGS. 3 and 4, in the embodiment shown in FIGS. 5 and 6, display shroud 162 is not physically supported by electronic shroud 60. Once cover chassis 50 is threadedly secured to housing 42, and deformable ring 164 and transparent cover piece 52 are mechanically clamped between cover flange 66 and housing surface 76, display shroud 162 is held in place by deformable ring 164. Importantly, by integrating deformable ring 164 and display shroud 162, LOI 32 can be positioned such that capacitive touch circuitry 34 and display circuitry 36 are consistently positioned relative to transparent cover piece 52. Such consistent positioning of LOI 32 provides for the desired viewing of display circuitry 36 and reliable operation of capacitance touch circuitry 34.

As shown further in FIGS. 5 and 6, additional support of display shroud 162 and LOI 32 is provided by elastomeric ring 78 which is disposed between a portion of display shroud 162 within housing 42 and an interior wall of housing 42. Elastomeric ring is, for example, an O-ring made of an elastomeric material. The additional support provided by elastomeric ring 78 increases the isolation of LOI 32 from sources of damaging vibration. Integration of deformable ring 164 with display shroud 162 further reduces the cost of industrial process transmitter 124 compared with industrial process transmitter 24 by eliminating the cost and extra handling associate with deformable ring 64 as a component separate from display shroud 62.

A method of assembling one embodiment of the present invention illustrated by process transmitter housing assembly 40 includes inserting transparent cover piece 52 into cover chassis 50 and against cover flange 66. Next, internal threads 70 of cover chassis 50 are threadedly engaged with external threads 68 of housing 42. Finally, transparent cover piece 52 is clamped between cover flange 66 and housing surface 76 by threadedly securing cover chassis 50 to housing 42.

The method of assembling process transmitter housing assembly 40 may further include inserting display circuitry 36 into housing 42 prior to engaging internal threads 70 with external threads 68 such that a digital display is viewable through transparent cover piece 52. The method of assembling process transmitter housing assembly 24 may further include inserting capacitive touch circuitry 34 into housing 42 prior to inserting display circuitry 36. It is understood that these two steps may be reversed or combined into a single step in a case where capacitive touch circuitry 34 and display circuitry 36 are first assembled into single unit, LOI 32.

The method of assembling process transmitter housing assembly 40 may further include inserting deformable ring 64 prior to engaging internal threads 70 with external threads 68; and clamping deformable ring 64 and transparent cover piece 52 together between cover flange 66 and housing surface 76. The method of assembling process transmitter assembly housing 40 may further include depositing an adhesive material 74 between transparent cover piece 52 and a portion of cover chassis 50 adjacent to cover flange 66 to form a cemented joint prior to engaging internal threads 70 with external threads 68. The method of assembling process transmitter assembly housing 40 may further include inserting sealing gasket 72 into cover chassis 50 and against cover flange 66 prior to inserting transparent cover piece 52 into cover chassis 50 and against cover flange 66; and clamping deformable ring 64, transparent cover piece 52 and sealing gasket 72 together between cover flange 66 and housing surface 76.

A method of assembling another embodiment of the present invention illustrated by process transmitter housing assembly 140 includes inserting transparent cover piece 52 into cover chassis 50 and against cover flange 66. Next, internal threads 70 of cover chassis 50 are threadedly engaged with external threads 68 of housing 42. Finally, transparent cover piece 52 is clamped between cover flange 66 and housing surface 76 by threadedly securing cover chassis 50 to housing 42.

The method of assembling process transmitter housing assembly 140 may further include inserting display circuitry 36 into housing 42 prior to engaging internal threads 70 with external threads 68 such that a digital display is viewable through transparent cover piece 52. The method of assembling process transmitter housing assembly 124 may further include inserting capacitive touch circuitry 34 into housing 42 prior to inserting display circuitry 36. It is understood that these two steps may be reversed or combined into a single step in a case where capacitive touch circuitry 34 and display circuitry 36 are first assembled into single unit, LOI 32.

The method of assembling process transmitter housing assembly 140 may further include inserting display shroud 162 including deformable ring 164 into housing 42 to support display circuitry 36 prior to engaging internal threads 70 with external threads 68; and clamping deformable ring 164 and transparent cover piece 52 together between cover flange 66 and housing surface 76. The method of assembling process transmitter assembly housing 140 may further include depositing an adhesive material 74 between transparent cover piece 52 and a portion of cover chassis 50 adjacent to cover flange 66 to form a cemented joint prior to engaging internal threads 70 with external threads 68. The method of assembling process transmitter assembly housing 140 may further include inserting sealing gasket 72 into cover chassis 50 and against cover flange 66 prior to inserting transparent cover piece 52 into cover chassis 50 and against cover flange 66; and clamping deformable ring 164, transparent cover piece 52 and sealing gasket 72 together between cover flange 66 and housing surface 76.

Those of ordinary skill in the art will appreciate that the present invention provides numerous advantages and benefits. Embodiments of the present invention include a process transmitter housing assembly with components that clamp a transparent cover piece in line with a housing to enable a local operator interface with as large a display as possible for a given housing size, while accommodating capacitive touch buttons. By employing the housing as a mechanical backup for the transparent cover piece, component costs associated with a separate mechanical backup, for example, a snap ring, are eliminated, reducing the cost of the process transmitter housing assembly. Some embodiments of the present invention integrate a deformable ring with a display shroud holding the local operator interface. By positioning the deformable ring between the transparent cover piece and the housing, the local operator interface can be positioned such that the capacitive touch buttons and the display are consistently positioned relative to the transparent cover piece. Consistent positioning of the local operator interface provides for the desired viewing of the display and for reliable operation of the capacitance touch buttons. Use of the display shroud with the integrated deformable ring also provides an opportunity to include an O-ring between the display shroud and the housing to increase isolation of the local operator interface from damaging vibration. Integration of the deformable ring with the display shroud further reduces the cost of the process transmitter housing assembly.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims. For example, the particular shape of an industrial process transmitter can vary as desired for particular applications, and the particular configuration of display circuitry and/or touch circuitry can vary as desired for particular applications.

The invention claimed is:

1. A process transmitter housing assembly comprising:
   a housing including external threads on an exterior of the housing; and
   a cover assembly including,
      a cover chassis including:
         a cover flange extending inward from a perimeter of the cover chassis at a first end of the cover chassis; and
         internal threads on an interior of the cover chassis at a second end of the cover chassis opposite the first end, the internal threads for threadedly engaging the external threads of the housing;
      a transparent cover piece mechanically clamped between the cover flange and a surface of the housing nearest the cover flange when the cover chassis is threadedly secured to the housing; and
      an adhesive material between the transparent cover piece and a portion of the cover chassis adjacent to the cover flange, the adhesive material filling a gap between the transparent cover piece to the cover chassis to provide a cemented joint.

2. The assembly of claim 1, further comprising:
display circuitry disposed within the housing for providing a digital display, the digital display viewable through the transparent cover piece.

3. The assembly of claim 1, further comprising:
a capacitive touch circuitry for providing touch actuation through the transparent cover piece.

4. A process transmitter housing assembly comprising:
a housing including external threads on an exterior of the housing; and
a cover assembly including,
   a cover chassis including:
      a cover flange extending inward from a perimeter of the cover chassis at a first end of the cover chassis; and
      internal threads on an interior of the cover chassis at a second end of the cover chassis opposite the first end, the internal threads for threadedly engaging the external threads of the housing; and
   a transparent cover piece mechanically clamped between the cover flange and a surface of the housing nearest the cover flange when the cover chassis is threadedly secured to the housing;
a display shroud for supporting display circuitry within the housing, the display circuitry providing a digital display viewable through the transparent cover piece; and
a deformable ring between the transparent cover piece and the housing such that the deformable ring and the transparent cover piece are clamped together between the housing and the cover flange when the cover chassis is threadedly secured to the housing.

5. The assembly of claim 4, wherein the cover assembly further comprises:
a sealing gasket disposed between transparent cover piece and the cover flange such that the deformable ring, the transparent cover piece, and the sealing gasket are clamped together between the housing and the cover flange when the cover chassis is threadedly secured to the housing.

6. The assembly of claim 4, further comprising:
an elastomeric ring disposed between a portion of the display shroud within the housing and an interior wall of the housing.

7. The assembly of claim 4, wherein the display shroud includes a circular flange integral with the display shroud, the circular flange forming the deformable ring between the transparent cover piece and the housing.

8. The assembly of claim 7, wherein the cover assembly further comprises:
a sealing gasket disposed between transparent cover piece and the cover flange such that the deformable ring, the transparent cover piece, and the sealing gasket are clamped together between the housing and the cover flange when the cover chassis is threadedly secured to the housing.

9. The assembly of claim 7, further comprising:
an elastomeric ring disposed between a portion of the display shroud within the housing and an interior wall of the housing.

10. A method of assembling a process transmitter housing assembly, the method comprising:
inserting a transparent cover piece into a cover chassis of the process transmitter and against a cover flange extending inward from a perimeter of the cover chassis at a first end of the cover chassis;
depositing an adhesive material between a transparent cover piece and a portion of the cover chassis adjacent to the cover flange before inserting the transparent cover piece into the cover chassis;
engaging threads on an interior of the cover chassis at a second end of the cover chassis opposite the first end with threads on an exterior of the housing of the process transmitter housing assembly; and
clamping the transparent cover piece between the cover flange and a surface of the housing nearest the cover flange by threadedly securing the cover chassis to the housing.

11. The method of claim 10, further comprising:
inserting display circuitry into the housing before engaging the threads on the interior of the cover chassis with the threads on the exterior of the housing such that a digital display is viewable through the transparent cover piece.

12. A method of assembling a process transmitter housing assembly, the method comprising:
inserting a transparent cover piece into a cover chassis of the process transmitter and against a cover flange extending inward from a perimeter of the cover chassis at a first end of the cover chassis;
engaging threads on an interior of the cover chassis at a second end of the cover chassis opposite the first end with threads on an exterior of the housing of the process transmitter housing assembly;
clamping the transparent cover piece between the cover flange and a surface of the housing nearest the cover flange by threadedly securing the cover chassis to the housing; and
inserting capacitive touch circuitry into the housing before engaging the threads on the interior of the cover chassis with the threads on the exterior of the housing for providing touch actuation through the transparent cover piece.

13. A method of assembling a process transmitter housing assembly, the method comprising:
inserting a transparent cover piece into a cover chassis of the process transmitter and against a cover flange extending inward from a perimeter of the cover chassis at a first end of the cover chassis;
engaging threads on an interior of the cover chassis at a second end of the cover chassis opposite the first end with threads on an exterior of the housing of the process transmitter housing assembly;
inserting a display shroud into the housing for supporting display circuitry;
inserting a deformable ring between the transparent cover piece and the surface of the housing nearest the cover flange before engaging the threads on the interior of the cover chassis with the threads on the exterior of the housing; and
clamping the transparent cover between the cover flange and the surface of the housing nearest the cover flange includes clamping the integral deformable ring and the transparent cover piece together between the cover flange and the surface of the housing nearest the cover flange.

14. The method of claim 13, further comprising:
installing an elastomeric ring around a portion of the display shroud before inserting the display shroud into the housing.

15. The method of claim 13, further comprising:
inserting a sealing gasket into the cover chassis and against the cover flange before depositing the adhesive material between the transparent cover piece and the portion of the cover chassis adjacent to the cover flange.

16. The method of claim 13, wherein the deformable ring is an integral part of the display shroud.

17. The method of claim 16, further comprising:
installing an elastomeric ring around a portion of the display shroud before inserting the display shroud into the housing.

18. The method of claim 16, further comprising:
inserting a sealing gasket into the cover chassis and against the cover flange before depositing the adhesive material between the transparent cover piece and the portion of the cover chassis adjacent to the cover flange; and
wherein clamping the transparent cover between the cover flange and the surface of the housing nearest the cover flange includes clamping the integral deformable ring, the transparent cover piece, and the sealing gasket together between the cover flange and the surface of the housing nearest the cover flange.

* * * * *